United States Patent
Du et al.

(10) Patent No.: US 9,647,397 B2
(45) Date of Patent: May 9, 2017

(54) PROGNOSIS OF CONNECTOR DISCONNECTION WITH CANARY-BASED SHORT TERMINALS

(71) Applicant: GM GLOBAL TECHNOLOGY OPERATIONS LLC, Detroit, MI (US)

(72) Inventors: Xinyu Du, Oakland Township, MI (US); Atul Nagose, Royal Oak, MI (US); Timothy D. Julson, Rochester Hills, MI (US); Aaron B. Bloom, Sterling Heights, MI (US); Gavril Cret, Troy, MI (US); Gary W. Taraski, Oxford, MI (US); Jan Henning Aase, Oakland Township, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 53 days.

(21) Appl. No.: 14/685,172

(22) Filed: Apr. 13, 2015

(65) Prior Publication Data
US 2016/0028193 A1    Jan. 28, 2016

Related U.S. Application Data

(60) Provisional application No. 62/028,662, filed on Jul. 24, 2014.

(51) Int. Cl.
| | |
|---|---|
| *H01R 13/66* | (2006.01) |
| *G01R 31/04* | (2006.01) |
| *H01R 13/641* | (2006.01) |
| *G01R 1/04* | (2006.01) |

(52) U.S. Cl.
CPC ........ *H01R 13/6683* (2013.01); *G01R 31/04* (2013.01); *G01R 31/043* (2013.01); *H01R 13/641* (2013.01); *G01R 1/0416* (2013.01)

(58) Field of Classification Search
CPC combination set(s) only.
See application file for complete search history.

(56) References Cited

U.S. PATENT DOCUMENTS

| | | | |
|---|---|---|---|
| 2004/0192092 A1* | 9/2004 | Borrego Bel | H01R 13/53 439/181 |
| 2005/0136723 A1* | 6/2005 | Dilliner | H01R 24/28 439/320 |
| 2012/0158344 A1* | 6/2012 | Himmelstoss | G01S 7/4017 702/108 |

* cited by examiner

*Primary Examiner* — Clayton E. Laballe
*Assistant Examiner* — Jas Sanghera
(74) *Attorney, Agent, or Firm* — John A. Miller; Miller IP Group, PLC

(57) ABSTRACT

A system and method for determining that a male terminal and a female terminal are becoming disconnected in a connector as a result of the connector becoming loose or the terminals becoming corroded. The connector is a multi-terminal connector including a male terminal housing that houses a plurality of male terminals and a female terminal housing that houses a plurality of associated female terminals. One of the male terminals is a diagnostic terminal that is shorter than the other male terminals so that it is disconnected from its associated female terminal before the other male terminals when the terminal housing separate, which can be used to detect connector failure.

10 Claims, 4 Drawing Sheets

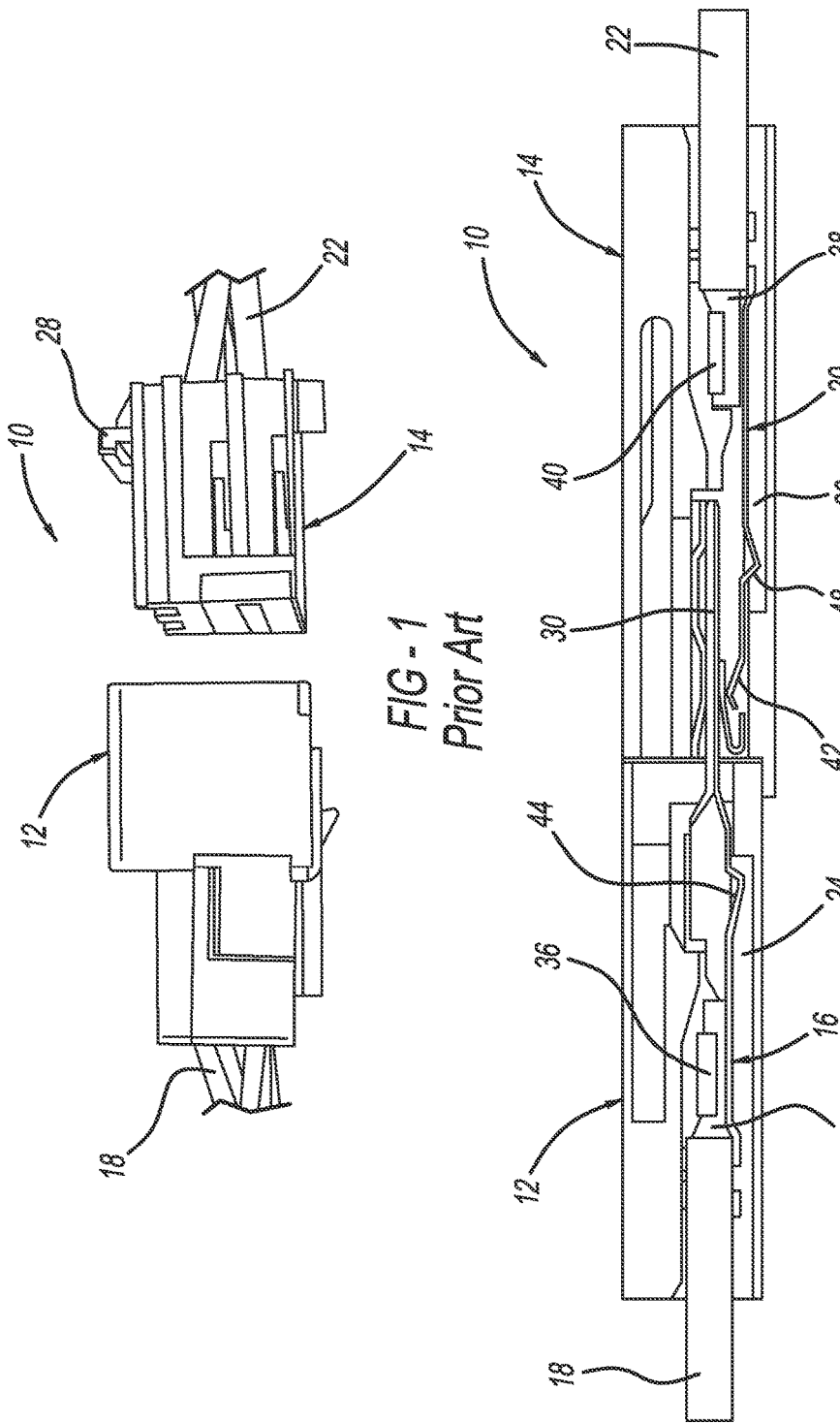

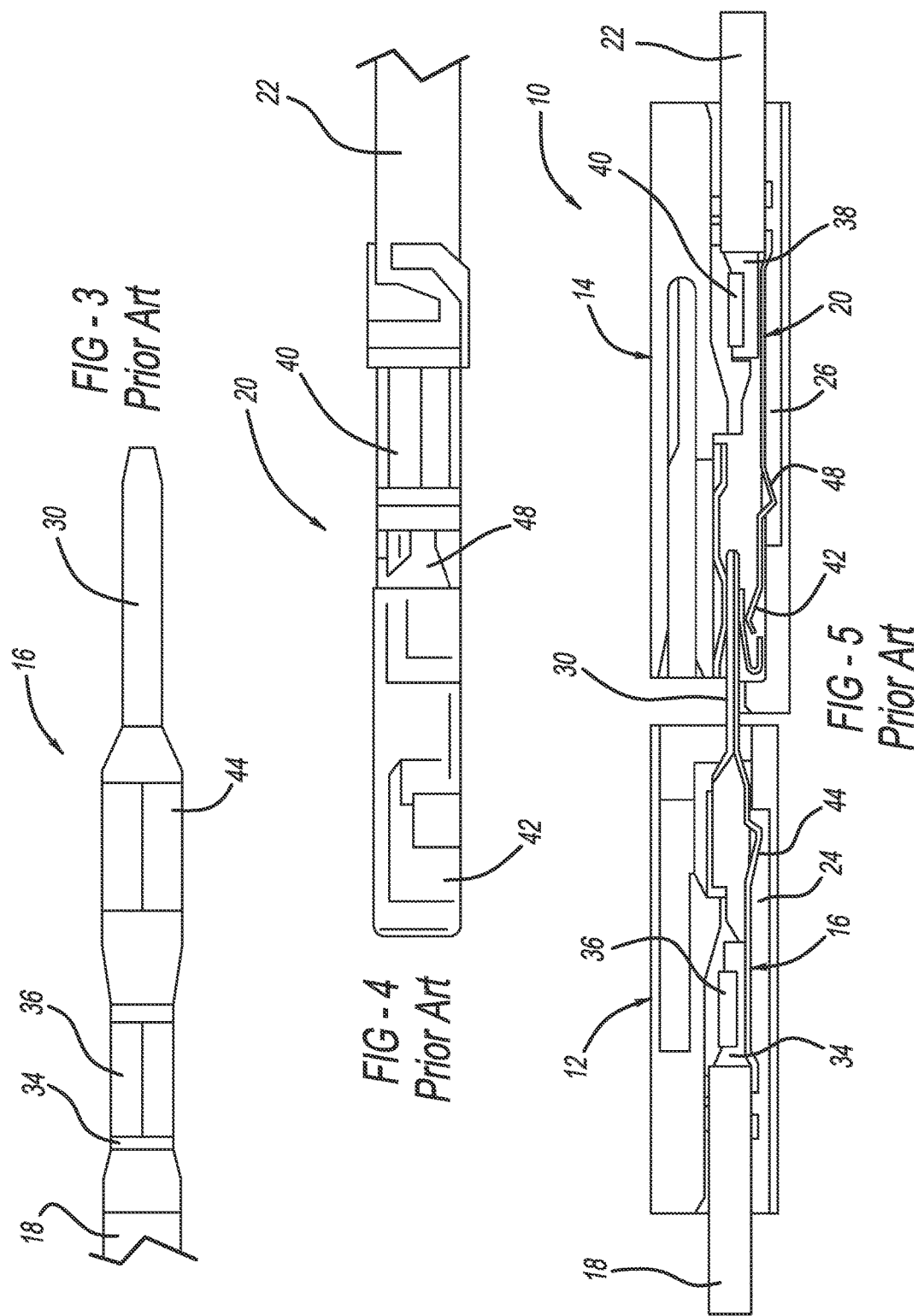

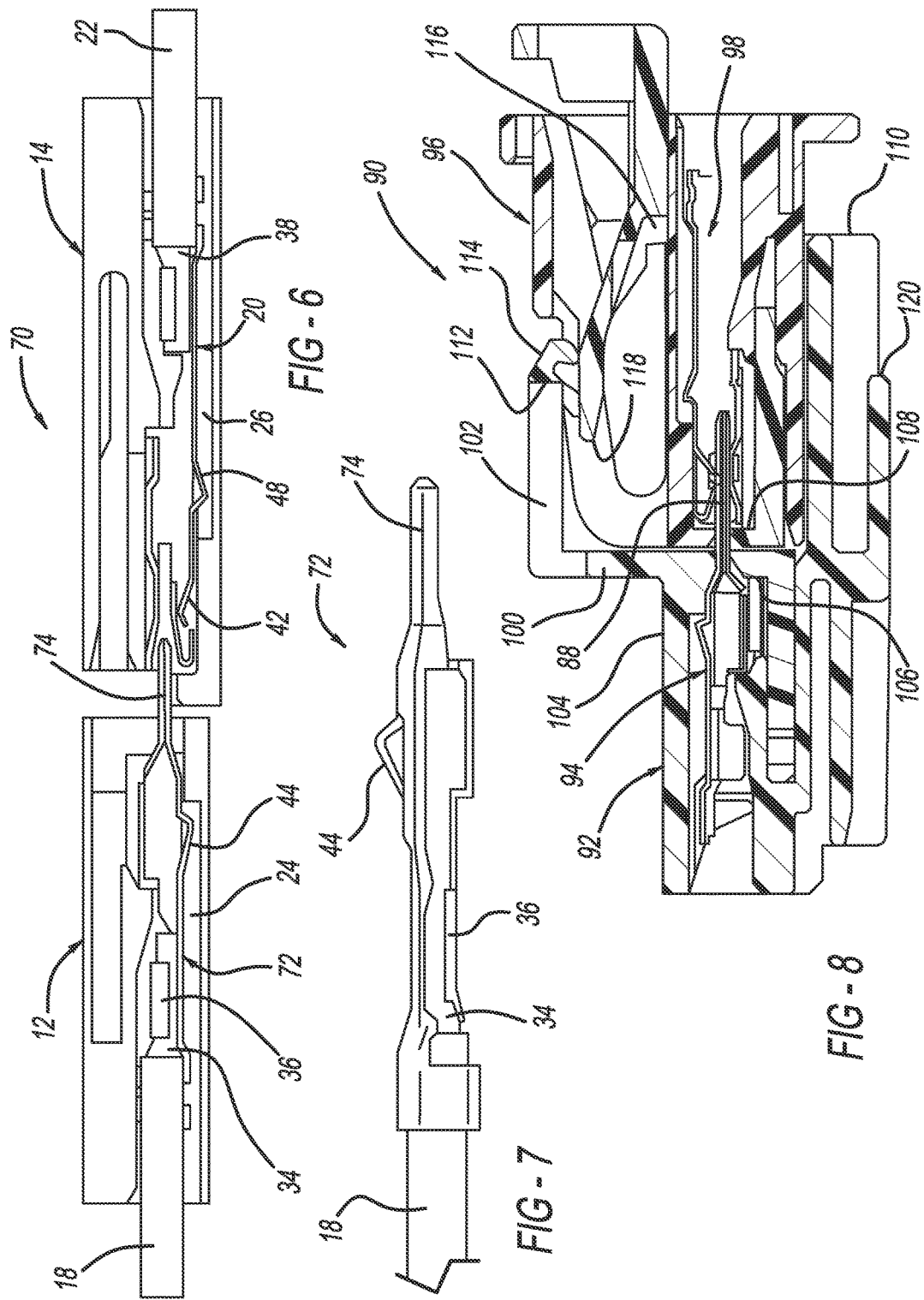

PROGNOSIS OF CONNECTOR DISCONNECTION WITH CANARY-BASED SHORT TERMINALS

CROSS-REFERENCE TO RELATED APPLICATIONS

This application claims the benefit of the priority date of U.S. Provisional Patent Application Ser. No. 62/028,662, titled, Prognosis of Connector Disconnection with Canary-Based Short Terminals, filed May 16, 2014.

BACKGROUND OF THE INVENTION

Field of the Invention

This invention relates generally to a system and method for monitoring an electrical connection of a connector and, more particularly, to a system and method for monitoring the electrical connections of a multi-terminal electrical connector by reducing the length of one of the male terminals in the connector to determine when the connector is becoming loose and/or becomes corroded.

Discussion of the Related Art

Various systems, such as vehicles, aircraft, marine vessels, building wiring, computers, electronics, robots, etc., often include many wires, connectors, terminals, electrical harnesses, etc. that provide an electrical signal path for various systems, sub-systems, controllers, sensors, actuators, etc. For example, the electrical systems in a vehicle typically include a number of multi-terminal connectors that simultaneously connect a number of wires. In one multi-connector design, wires are electrically connected using gender specific male and female terminals. The male terminals are inserted into the female terminals when the terminal housings are joined to make the electrical connections between the wires. Typically, the male terminal is held within the female terminal by a spring clip, which provides tension to assure electrical contact. The connector housing provides a secure terminal-to-terminal contact through various locking designs.

For the above described connectors, the male terminal is held within the female terminal under a certain amount of tension or friction with enough force to make the electrical connection, but also allow the terminal housings to be manually separated. Further, the male terminal is inserted into the female terminal a distance so that the male terminal and the female terminal make electrical contact along some defined length of the terminals. As a result of vehicle vibration and the like, the male terminal sometimes separates from the female terminal, where the terminal housings become separated. Once the male terminal is removed from the female terminal a certain amount, the terminal housings are disconnected and electrical connection between the male terminal and the female terminal is lost. Further, as a result of wet driving conditions, the male terminal and/or the female terminal may corrode, where the electrical resistance between the male terminal and the female terminal increases as a result of the corrosion and eventually may become electrically disconnected as a result of too high of a resistance.

Various tools and approaches are known in the art to detect and localize the electrical disconnection of a vehicle connector. These tools and approaches include systems that employ Sital Tool™, PSpice™, spread-spectrum, time-domain reflectometry (SSTDR), frequency-domain transmissometry/time-domain transmissometry (FDT/TDT) and resistance, inductance and capacitance (RLC) monitoring. However, all of these known approaches are only able to determine when the electrical connection between the two terminals is lost, and are unable to determine when the connection is becoming loose, where the male terminal and the female terminal are still making electrical contact.

What is needed in the art is a prognosis technique for determining when the electrical connection between a male terminal and a female terminal in a connector is being reduced as a result of a loose connection or corrosion before the electrical connection is completely lost so that remedial steps can be taken.

SUMMARY OF THE INVENTION

The present disclosure describes a system and method for determining that a male terminal and a female terminal are becoming disconnected in a connector as a result of the connector becoming loose or the terminals becoming corroded. The connector is a multi-terminal connector including a male terminal housing that houses a plurality of male terminals and a female terminal housing that houses a plurality of associated female terminals. One of the male terminals is a diagnostic terminal that is shorter than the other male terminals so that it is disconnected from its associated female terminal before the other male terminals when the terminal housings separate, which can be used to detect connector failure.

Additional features of the present invention will become apparent from the following description and appended claims, taken in conjunction with the accompanying drawings.

BRIEF DESCRIPTION OF THE DRAWINGS

FIG. 1 is an exploded isometric view of a known electrical connector for a vehicle showing separated male and female terminal housings;

FIG. 2 is a cross-sectional view of the electrical connector shown in FIG. 1 showing the terminal housings secured together;

FIG. 3 is an isometric view of a male terminal removed from the male terminal housing in the connector shown in FIG. 1;

FIG. 4 is an isometric view of a female terminal removed from the female terminal housing in the connector shown in FIG. 1;

FIG. 5 is a cross-sectional view of the electrical connector shown in FIG. 1 with the terminal housings partially separated;

FIG. 6 is a cross-sectional view of an electrical connector including a short diagnostic male terminal;

FIG. 7 is an isometric view of the short diagnostic male terminal separated from the connector shown in FIG. 6;

FIG. 8 is a cross-sectional view of a connector including male and female terminal housings connected together;

DETAILED DESCRIPTION OF THE EMBODIMENTS

Figure 9:
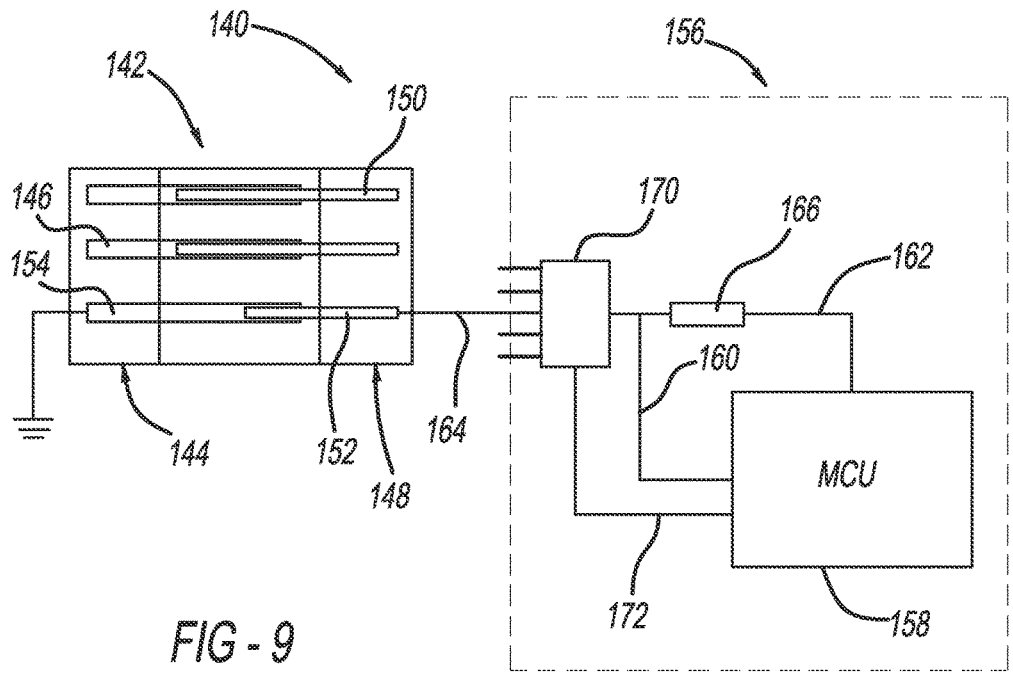
FIG. 9 is a schematic block diagram of a multi-terminal connector and detection circuitry.

The following discussion of the embodiments of the invention directed to a system and method for identifying a failing connection in a multi-terminal electrical connector is merely exemplary in nature, and is in no way intended to limit the invention or its applications or uses. Particularly, the discussion below specifically discusses a vehicle connector. However, as will be appreciated by those skilled in the art, the system and method will have application for other types of connectors and for other types of systems.

FIG. 1 is an exploded isometric view of a known multi-terminal electrical connector 10 including a male terminal housing 12 and a female terminal housing 14 and FIG. 2 is a cross-sectional view of the connector 10 showing the terminal housings 12 and 14 coupled together. In this non-limiting embodiment, the connector 10 is the Delphi 10-way inline multi-terminal connector including ten male terminals and female terminals. The male terminal housing 12 encloses a number of male terminals 16 each being connected to a separate wire 18 extending into the housing 12, and the female terminal housing 14 encloses the same number of female terminals 20 each being connected to a separate wire 22 extending into the housing 14, where the male terminals 16 are positioned and held within a cavity 24 in the housing 12 and the female terminals 20 are positioned and held within a cavity 26 in the housing 14. The housings 12 and 14 are secured together in a snap fit engagement by a clip 28, where each male terminal 16 is inserted into its corresponding female terminal 20, as will be discussed in more detail below.

FIG. 3 is an isometric view of one of the male terminals 16 removed from the male terminal housing 12 and FIG. 4 is an isometric view of one of the female terminals 20 removed from the female terminal housing 14. Each male terminal 16 is electrically coupled to an inner conductor 34 of one of the wires 18 by a crimp connection 36 and each female terminal 20 is electrically connected to an inner conductor 38 of one of the wires 22 by a crimp connection 40. Each female terminal 20 includes a spring portion 42 that engages a tip 30 of the male terminal 16 when the male terminal 16 is inserted into the female terminal 20 to hold the male terminal 16 within the female terminal 20 in a friction fit that provides the electrical connection. Further, each of the male terminals 16 includes a mounting portion 44 that secures the male terminal 16 within the cavity 24 and each of the female terminals 20 includes a mounting portion 48 that secures the female terminal 20 within the cavity 26.

The connector 10 is designed so that the tip 30 of the male terminal 16 is inserted into the female terminal 20 some distance to provide an electrical connection along a length of the terminals 16 and 20. Therefore, if the connection between the terminal housings 12 and 14 becomes loose as a result of vehicle vibration or the like, where the male terminals 16 are withdrawn a distance from the female terminals 20, an electrical connection will still be maintained for some distance as the male terminal 16 is removed from the female terminal 20. FIG. 5 is an illustration of the connector 10 in this configuration, where the terminal housings 12 and 14 are separated by some minimal distance, but electrical connection between the terminals 16 and 20 is maintained. In one known connector design, the male terminal 16 can be withdrawn from the female terminal 20 about 4.33 mm and still maintain an electrical connection therebetween.

As mentioned above, it is desirable to provide a prognosis for when the housings 12 and 14 are partially disconnected, but the male terminals 16 are still making electrical contact with the female terminals 20 in anticipation that the terminal housings 12 and 14 will continue to separate and eventually one or more of the connections between the male terminals 16 and the female terminals 20 will be lost. The present invention proposes providing a diagnostic and prognostic male terminal that is shorter than the other male terminals in the particular connector so that the diagnostic male terminal electrically disengages the female terminal before the other male terminals in the connector, where that electrical disconnection can be detected.

FIG. 6 is a cross-sectional view of a multi-terminal electrical connector 70 similar to the connector 10, where like elements are identified by the same reference numeral, showing the terminal housings 12 and 14 in the same position as in FIG. 5. The connector 70 includes a short diagnostic male terminal 72, which can be added, as one of the several male terminals within the connector 70, where the other male terminals in the connector 70 are the same as the male terminals 18 discussed above. FIG. 7 is an isometric view of the short diagnostic male terminal 72 removed from the connector 70. As is apparent, the terminal 72 is shorter than the other male terminals because its tip 74 is shorter than the tip 30, where it is the tip 74 that electrically engages the female terminal 20.

As shown in FIG. 6, because the diagnostic male terminal 72 is significantly shorter than the other male terminals 18, it will disengage from its associated female terminal 20 before the other male terminals 18 disengage from their associated female terminals providing an indication of a pending failure with the connector 70. More particularly, when the terminal housings 12 and 14 are initially secured together, all of the male terminals including the short diagnostic male terminal 72 are electrically coupled to their associated female terminal. As the connector 70 becomes loose and the terminal housings 12 and 14 separate, the short diagnostic male terminal 72 will electrically disengage from its associated female terminal 20 before the other normal male terminals 18 electrically disengage from their associated female terminal, thus providing a way to determine that the terminal housings 12 and 14 are separating before electrical connection is lost for the particular vehicle system.

For each particular connector, it will be necessary to determine the optimal length of the short diagnostic male terminal relative to the length of the other male terminals. FIG. 8 is a cross-sectional view of an electrical connector 90 including a male terminal housing 92 that houses male terminals including a short diagnostic male terminal 94 having a tip 88, and a female terminal housing 96 that houses female terminals 98 that can be used to illustrate how the optimal length of the short male terminal 94 can be determined in one non-limiting example. The configuration of the connector 90 is similar, but not the same as the connectors 10 and 70.

The male terminal housing 92 includes a cavity back stop 100, a male lock ramp 102, a shroud base 104 and a front cavity 106, and the female terminal housing 96 includes a cavity back stop 108, a female housing front edge 110, a front shroud 112, a lock ramp 114, a female connector lock 116, a forward stop 118 and a back stop 120. Using these elements, the following distances are defined. The radius tangent to the tip 88 of the short male terminal 94 is designated as length A, the distance between the tip 88 and the back stop 120 is designated as length B, the distance between the cavity back stop 100 and the back stop 120 is designated as length C, the distance between the back stop 100 and the front edge 110 is designated as length D, the distance between the front edge 110 and the front shroud 112 is designated as length E, the distance between the front edge 110 and the lock ramp 114 is designated as length F, the distance between the male lock ramp 102 and the female connector lock 116 is designated as length G, the distance between the lock ramp 102 and the shroud base 104 is designated as length H, the distance between the shroud base 104 and the front cavity 106 is designated as length I, the distance between the front cavity 106 and the forward stop 118 is designated as length J, and the distance between the forward stop 118 and the back stop 120 is designated as length K.

One non-limiting procedure for determining the optimal length of the short male terminal 94 includes first calculating the nominal value of terminal overlap without the tip 88 as:

$$\text{Overlap} = A - B - C + D - E + F - G - H - I - K + J. \tag{1}$$

The procedure calculates the nominal length $L_{ST}$ of the short male terminal 94 using equation (1) as:

$$L_{ST} = J - \text{Overlap} - K = A + B + C - D + E - F + G + H + I. \tag{2}$$

The procedure calculates the minimum/maximum length $L_{ST\_Min}/L_{ST\_Max}$ of the short male terminal 94 using equations (1) and (2) and minimum and maximum tolerances by equations (3) and (4). The minimum and maximum tolerances are determined because all of the lengths A-K have a minimum and maximum value subject to manufacturing tolerances.

$$L_{ST\_Min} = \min(B + C + E + G + H + I) - \max(A + D + F), \tag{3}$$

$$L_{ST\_Max} = \max(B + C + E + G + H + I) - \min(A + D + F). \tag{4}$$

The procedure then selects the length $L_{ST}$_Max as the optimal length of the short male terminal 94.

In another embodiment for determining the optimal length of the short male terminal 94, the procedure determines the length $L_1$ from the female housing front edge 110 to the tip 88 as:

$$L_1 = B + C - A. \tag{5}$$

The procedure then determines the length $L_2$ from the male terminal back stop 100 to the lock ramp 114 as:

$$L_2 = I + H + G + E - F. \tag{6}$$

The procedure then determines the length $L_{ST}$ from the male terminal back stop 100 to the tip 88 as:

$$L_{ST} = L_2 - D + L_1, \tag{7}$$

$$= -A + B + C - D + E - F + G + H + I. \tag{8}$$

The procedure then determines the length $L_0$ of the terminal overlap as:

$$L_0 = J - K - L_{ST}. \tag{9}$$

The procedure also includes validating the optimal length $L_{ST}$ of the short male terminal 94. This procedure includes preparing the terminals 94 and 98 for multiple connectors with the optimal length calculated as discussed above. The procedure then includes installing the terminals 94 and 98 in the cavities of the connector 90 and in the latched position holding the short male terminal 94. The procedure then includes moving the female terminal 98 to different orientations, such as up, down, left, right, pull wires out, push wires in, etc., and if the terminals 94 and 98 are connected for every cavity and orientation, then the length $L_0$ is confirmed. Otherwise, the procedure requires more terminals to be prepared with longer lengths and the above steps repeated.

The discussion above refers to a prognosis determination for when a connector may be coming loose before the male and female terminals actually disengage. In another embodiment, the short male diagnostic terminal 72 can also be used to make a determination that the other terminals may be failing as a result of corrosion on the terminals. Particularly, a prognostic tool can be employed that measures the resistance of the connection between the short diagnostic terminal 72 and the female terminal 20.

FIG. 9 is a schematic block diagram of a system 140 for detecting a connector fault as a result of disconnected terminals or corrosion on the terminals, as discussed above. The system 140 includes an electrical connector 142 including a female terminal housing 144 that houses a number of female terminals 146 and a male terminal housing 148 that houses a number of normal male terminals 150 and a short diagnostic male terminal 152 inserted into one of the female terminals 154, as shown, where the short diagnostic terminal 152 can be added to the connector 142 or be an existing terminal in the connector 142 that has been shortened. The female terminal 154 is connected to ground and the short male terminal 152 is connected to a controller 156, such as an electrical control unit (ECU), including a microcontroller unit (MCU) 158. The MCU 158 includes an input line 160 and an output line 162, where the output line 162 is connected to a line 164 that is connected to the short male terminal 152 through a resistive element 166 having a resistive value R whose value is selected based on corrosion characteristics, and the input line 160 is connected directly to the line 164.

A multiplexer 170 is provided that is connected to several short male terminals in several other connectors (not shown) so that the same MCU 158 can be used to monitor the electrical connections of all of the connectors. A control line 172 controls the multiplexer 170 to select which of the several connectors are being monitored at any particular point in time. Because providing analog channels for detection purposes in this manner is relatively expensive and there are a large number of connectors on the vehicle, it is desirable to use a single analog channel for multiple connectors in order to save cost. A typical multiplexer may have thirty-two output ports.

A voltage potential, such as 5 volts, is provided on the output line 162, which is applied to the resistive element 166. If the short male terminal 152 is electrically connected to the female terminal 154, then the voltage potential provided on the line 162 through the ground connection provides a low signal on the input line 160. If the short terminal 152 is withdrawn from the female terminal 154 breaking the electrical connection between the MCU 158 and ground, the voltage signal on the input line 160 goes high, indicating a fault. In other words, when the short male terminal 152 is fully engaged with the female terminal 154 without any corrosion, then the analog input voltage on the line 160 is the reference voltage or ground, here zero, within some tolerance $\epsilon$. If the short male terminal 152 becomes disconnected from the female terminal 154 and the analog input on the line 160 is no longer connected to ground, then the analog input voltage is equal to the analog output voltage, here 5 volts, within some tolerance $\epsilon$.

Further, if corrosion builds up on the female terminal 154 or the short male terminal 152 reducing their electrical contact and increasing a corrosion resistance value $R_{corr}$, then the divided voltage provided by $R_{corr}$ and the resistance R of the resistive element 166 causes the voltage on the input line 160 to increase, providing an indication that electrical contact is being lost. The resistive value R of the resistive element 166 is selected based on the corrosion characteristics of the short male terminal 152 and the female terminal 154, and may be, for example, 1 ohm.

For the embodiment discussed above, the connection between the short male terminal 152 and the female terminal 154 is normal when the voltage potential AI on the input line 160 equals 0±εV, where ε is a predetermined tolerance. When the short male terminal 152 is removed from the female terminal 154, then a connector fault is indicated when AI=5±εV. Terminal corrosion can be monitored by equation (10) below, where the voltage AI can be used to determine the useful life of the connector 142 based on a predetermined time series model.

$$AI = \frac{AO}{R + R_{corr}} R_{corr}. \qquad (10)$$

Figure 10:
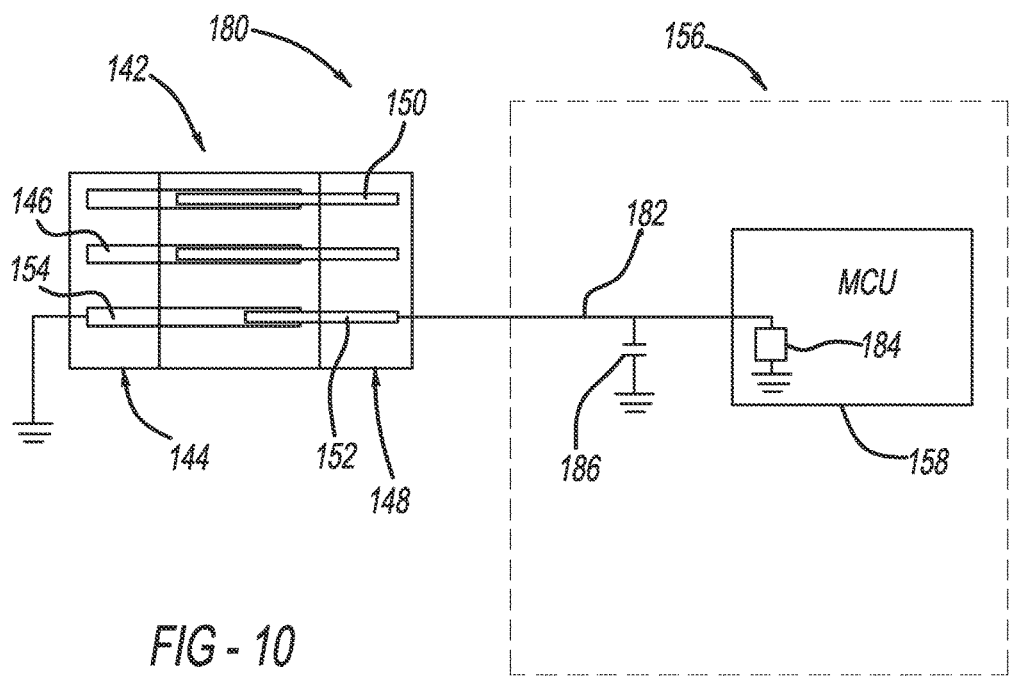
FIG. 10 is a schematic block diagram of a multi-terminal connector and detection circuitry.

FIG. 10 is a schematic block diagram of a system 180 similar to the system 140, where like elements are identified by the same reference number, but which cannot determine how much corrosion is on the male and female terminals. In one embodiment used by the system 180, a digital diagnostic trouble code (DTC) signal provided on line 182 and coupled through resistive element 184 in the MCU 158 is used instead of an analog voltage to determine if the short male terminal 152 is removed from the female terminal 154. A low pass filter 186 is coupled to the line 182. If the short terminal 152 and the female terminal 154 are electrically coupled, then the DTC signal is at the reference voltage of ground plus the tolerance ε, such as 12±ε1V. If the short terminal 152 and the female terminal 154 become disconnected, then the DTC signal increases significantly above the reference voltage, such as 0±ε2V, which can provide an indication of a loose connector, where the circuit is not shorted to ground, i.e., the battery voltage can be cross-referenced from the body control module (BCM) or the engine control module (ECM).

In an alternate embodiment used by the system 180, the short terminal 152 is a connection for a non-critical element such as a turn signal. The turn signal circuit can be configured so that when the short male terminal 152 and the female terminal 154 are connected a slow flashing turn signal occurs indicating a normal connection and when the short male terminal 152 and the female terminal 154 are disconnected a fast flashing turn signal occurs, which is part of the existing turn signal circuit, indicating a loose or failing connection. It is noted that the turn signal circuit is by way of a non-limiting example in that any suitable non-critical existing circuit can be employed.

As will be well understood by those skilled in the art, the several and various steps and processes discussed herein to describe the invention may be referring to operations performed by a computer, a processor or other electronic calculating device that manipulate and/or transform data using electrical phenomenon. Those computers and electronic devices may employ various volatile and/or non-volatile memories including non-transitory computer-readable medium with an executable program stored thereon including various code or executable instructions able to be performed by the computer or processor, where the memory and/or computer-readable medium may include all forms and types of memory and other computer-readable media.

The foregoing discussion disclosed and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. An electrical connector comprising:
   a male terminal housing including a diagnostic male terminal and a plurality of normal male terminals where the diagnostic male terminal has a shorter length than the plurality of normal male terminals;
   a female terminal housing including a plurality of female terminals where each female terminal accepts an associated male terminal when the female terminal housing and the male terminal housing are joined in an electrical engagement; and
   detection circuitry that detects whether the diagnostic male terminal becomes disconnected from its associated female terminal, where the detection circuitry includes a controller electrically coupled to the diagnostic male terminal, a resistive element, a control line electrically coupled to diagnostic male terminal and the resistive element, an input line electrically coupled to the control line and the controller and an output line electrically coupled to the resistive element and the controller, and where the associated female terminal is electrically coupled to ground, wherein the controller provides a diagnostic trouble code signal on the output line and monitors the voltage potential on the input line to determine whether the diagnostic male terminal has become disconnected from its associated female terminal.

2. The connector according to claim 1 wherein the plurality of normal male terminals all have the same length.

3. The connector according to claim 1 wherein each male terminal has a tip and wherein the tip of each male terminal engages its associated female terminal along its length, where the tip of the diagnostic male terminal engages less of the length of its associated female terminal than the tips of the normal male terminals.

4. The connector according to claim 1 wherein the length of the diagnostic male terminal is determined by internal structures of the male and female terminal housings.

5. The connector according to claim 1 wherein the detection circuitry also detects corrosion on the diagnostic male terminal or its associated female terminal.

6. The connector according to claim 1 wherein the connector is a vehicle connector.

7. An electrical connector assembly for a vehicle, said connector assembly comprising:
   a male terminal housing including a diagnostic male terminal and a plurality of normal male terminals where the plurality of normal male terminals all have the same length and the diagnostic male terminal has a shorter length than the plurality of normal male terminals;
   a female terminal housing including a plurality of female terminals where each female terminal accepts an associated male terminal when the female terminal housing and the male terminal housing are joined in an electrical engagement; and
   detection circuitry that detects when the diagnostic male terminal becomes disconnected from its associated female terminal, where the detection circuitry includes a controller electrically coupled to the diagnostic male terminal, a resistive element, a control line electrically coupled to diagnostic male terminal and the resistive element, an input line electrically coupled to the control line and the controller and an output line electrically coupled to the resistive element and the controller, and where the associated female terminal is electrically coupled to ground, wherein the controller provides a diagnostic trouble code signal on the output line and monitors the voltage potential on the input line to determine whether the diagnostic male terminal has become disconnected from its associated female terminal.

8. The connector assembly according to claim 7 wherein the detection circuitry also detects corrosion on the diagnostic male terminal or its associated female terminal.

9. An electrical connector comprising:
a male terminal housing including a diagnostic male terminal and a plurality of normal male terminals where the diagnostic male terminal has a shorter length than the plurality of normal male terminals; and
a female terminal housing including a plurality of female terminals where each female terminal accepts an associated male terminal when the female terminal housing and the male terminal housing are joined in an electrical engagement, wherein each male terminal has a tip and wherein the tip of each male terminal engages its associated female terminal along its length, where the tip of the diagnostic male terminal engages less of the length of its associated female terminal than the tips of the normal male terminals, and wherein the length of the diagnostic male terminal is determined by internal structures of the male and female terminal housings; and
detection circuitry that detects whether the diagnostic male terminal becomes disconnected from its associated female terminal, where the detection circuitry includes a controller electrically coupled to the diagnostic male terminal, a resistive element, a control line electrically coupled to diagnostic male terminal and the resistive element, an input line electrically coupled to the control line and the controller and an output line electrically coupled to the resistive element and the controller, and where the associated female terminal is electrically coupled to ground, wherein the controller provides a diagnostic trouble code signal on the output line and monitors the voltage potential on the input line to determine whether the diagnostic male terminal has become disconnected from its associated female terminal.

10. The connector according to claim 9 wherein the detection circuitry also detects corrosion on the diagnostic male terminal or its associated female terminal.

* * * * *